United States Patent

Choi et al.

(10) Patent No.: US 8,968,607 B2
(45) Date of Patent: Mar. 3, 2015

(54) PASTE COMPOSITION FOR SOLAR CELL ELECTRODES AND ELECTRODE FABRICATED USING THE SAME

(71) Applicants: Young Wook Choi, Uiwang-si (KR); Eun Kyung Kim, Uiwang-si (KR); Young Ki Park, Uiwang-si (KR); Dae Seop Song, Uiwang-si (KR)

(72) Inventors: Young Wook Choi, Uiwang-si (KR); Eun Kyung Kim, Uiwang-si (KR); Young Ki Park, Uiwang-si (KR); Dae Seop Song, Uiwang-si (KR)

(73) Assignee: Cheil Industries, Inc., Gumi-si, Kyeongsangbuk-do (KR)

( * ) Notice: Subject to any disclaimer, the term of this patent is extended or adjusted under 35 U.S.C. 154(b) by 0 days.

(21) Appl. No.: 13/951,600

(22) Filed: Jul. 26, 2013

(65) Prior Publication Data

US 2014/0131629 A1    May 15, 2014

(30) Foreign Application Priority Data

Nov. 12, 2012  (KR) .................... 10-2012-0127763

(51) Int. Cl.
*H01B 1/22*     (2006.01)
*H01L 31/0224*  (2006.01)
*B05D 5/12*     (2006.01)

(52) U.S. Cl.
CPC ......... *H01L 31/022425* (2013.01); *Y02E 10/50* (2013.01)
USPC .............. 252/512; 252/514; 136/252; 427/58

(58) Field of Classification Search
USPC .......................... 252/512–514; 136/252–256
See application file for complete search history.

(56) References Cited

U.S. PATENT DOCUMENTS

| | | | |
|---|---|---|---|
| 5,663,109 A  * | 9/1997 | Dietz et al. ........................ | 501/41 |
| 8,497,420 B2 * | 7/2013 | Carroll et al. .................. | 136/256 |
| 2011/0309312 A1 | 12/2011 | Sugiyama et al. | |
| 2013/0049148 A1* | 2/2013 | Hang et al. ..................... | 257/431 |

FOREIGN PATENT DOCUMENTS

| | | |
|---|---|---|
| JP | 2010-199334 A | 9/2010 |
| KR | 10-2011-0046358 A | 5/2011 |

* cited by examiner

*Primary Examiner* — Mark Kopec
(74) *Attorney, Agent, or Firm* — Lee & Morse, P.C.

(57) ABSTRACT

A paste composition for a solar cell electrode includes including an organic vehicle, a conductive powder, and a glass frit, the glass frit including $TeO_2$, and a transition metal oxide component, the transitional metal oxide component including one or more of a transition metal oxide having a melting point of about 1300° C. or more.

14 Claims, 1 Drawing Sheet

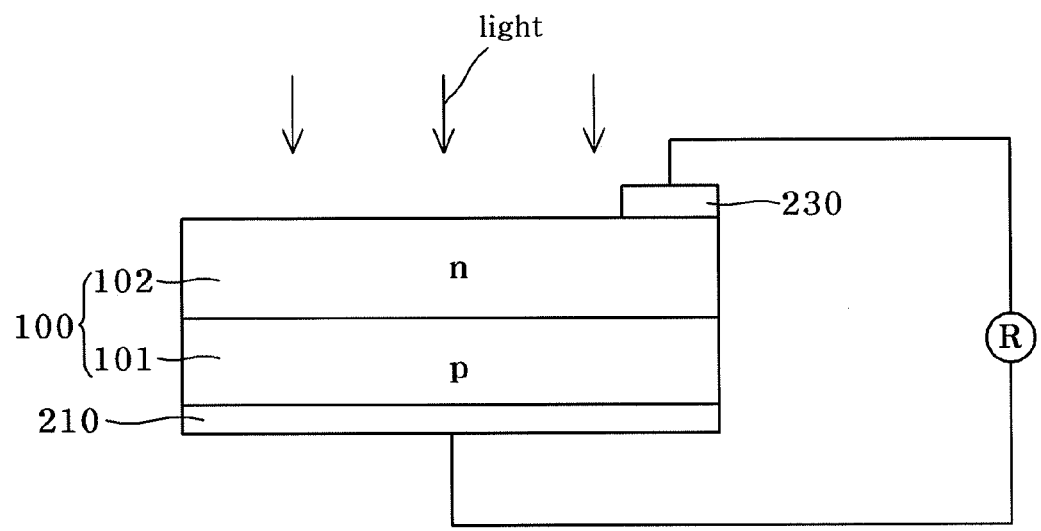

PASTE COMPOSITION FOR SOLAR CELL ELECTRODES AND ELECTRODE FABRICATED USING THE SAME

CROSS-REFERENCE TO RELATED APPLICATION

The present application claims priority under 35 U.S.C. §119 to Korean Patent Application No. 10-2012-0127763, filed on Nov. 12, 2012, in the Korean Intellectual Property Office, and entitled: "Paste Composition for Solar Cell Electrodes and Electrode Fabricated Using the Same," which is incorporated by reference herein in its entirety.

1. Field

Embodiments relate to a paste composition for solar cell electrodes and electrodes fabricated using the same.

2. Description of Related Art

Solar cells may be used to generate electric energy through the photovoltaic effect of a p-n junction that converts photons of sunlight into electricity. In the solar cell, a front electrode and a rear electrode may be respectively formed on upper and lower surfaces of a substrate, e.g., a semiconductor wafer, etc., with the p-n junction. The photovoltaic effect of the p-n junction may be induced by sunlight entering the semiconductor wafer and electrons generated by the photovoltaic effect of the p-n junction provide electric current flowing to the outside through the electrodes.

SUMMARY

Embodiments are directed to a paste composition for a solar cell electrode, the composition including an organic vehicle, a conductive powder, and a glass frit, the glass fit including $TeO_2$, and a transition metal oxide component, the transitional metal oxide component including one or more of a transition metal oxide having a melting point of about 1300° C. or more.

The glass fit may include about 1 wt % to about 15 wt % of the transition metal oxide component.

The transition metal oxide may include at least one of NiO, $WO_3$ and $Co_2O_3$.

A weight ratio of the $TeO_2$ to the transition metal oxide component may range from about 2:1 to about 5:1.

The glass frit may include about 15 wt % to about 70 wt % of the $TeO_2$.

The $TeO_2$ and the transition metal oxide component may be present in a total amount of about 16 wt % to about 75 wt % in the glass fit.

The glass fit may further include about 5 wt % to about 35 wt % of $Bi_2O_3$ and about 10 wt % to about 50 wt % of PbO.

The glass frit may further include about 1 wt % to about 20 wt % of ZnO.

The glass frit may further include one or more of $Al_2O_3$, $ZrO_2$, $P_2O_5$, $SiO_2$, $Na_2O$, $B_2O_3$, $Ta_2O_5$, $Fe_2O_3$, $Cr_2O_3$, $CO_2O_3$, $Li_2O$, $Li_2CO_3$, MgO, or $MnO_2$.

The conductive powder may include one or more of silver, gold, palladium, platinum, copper, chromium, cobalt, aluminum, tin, lead, zinc, iron, iridium, osmium, rhodium, tungsten, molybdenum, nickel, or indium tin oxide powder.

The organic vehicle may include one or more of a binder or a solvent.

The composition may include about 5 wt % to about 30 wt % of the organic vehicle, about 60 wt % to about 90 wt % of the conductive powder, and about 1 wt % to about 10 wt % of the glass frit.

The composition may further include one or more of a dispersant, a thixotropic agent, a plasticizer, a viscosity stabilizer, an anti-foaming agent, a pigment, a UV stabilizer, an antioxidant, or a coupling agent.

Embodiments are also directed to a solar cell electrode fabricated using the composition according to an embodiment.

Embodiments are also directed to a method of fabricating a solar cell having a solar cell electrode, the method including printing the composition according to an embodiment on a substrate, and baking the substrate having the composition thereon to form the solar cell electrode.

BRIEF DESCRIPTION OF DRAWINGS

Features will become apparent to those of skill in the art by describing in detail example embodiments with reference to the attached drawing in which:

FIG. 1 illustrates a schematic view of a solar cell manufactured using a paste composition in accordance with an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

An example embodiment relates to a paste composition for solar cell electrodes, which includes a conductive powder, a glass frit, and an organic vehicle.

In an example embodiment, the composition may include about 60 wt % to about 90 wt % of the conductive powder, about 1 wt % to about 10 wt % of the glass fit, and about 5 wt % to about 30 wt % of the organic vehicle.

Conductive Powder

Examples of the conductive powder may include silver (Ag), gold (Au), palladium (Pd), platinum (Pt), copper (Cu), chromium (Cr), cobalt (Co), aluminum (Al), tin (Sn), lead (Pb), zinc (Zn), iron (Fe), iridium (Ir), osmium (Os), rhodium (Rh), tungsten (W), molybdenum (Mo), nickel (Ni), and magnesium (Mg) powder, etc. These conductive powders may be used alone or as a mixture or alloy of two or more thereof. The conductive powder may include silver powder. In some example embodiments, the conductive powder may further include nickel (Ni), cobalt (Co), iron (Fe), zinc (Zn), or copper (Cu) powder in addition to the silver powder. In some example embodiments, the conductive powder may include indium tin oxide (ITO) powder.

The conductive powder may have a spherical, flake, or amorphous particle shape.

The conductive powder may be a mixture of conductive powders having different particle shapes.

The conductive powder may have an average particle size D50 of about 0.1 μm to about 3 μm. The average particle size may be measured using, for example, a Model 1064D particle size analyzer (CILAS Co., Ltd.) after dispersing the conductive powder in isopropyl alcohol (IPA) at 25° C. for 3 minutes via ultrasonication. Within this range of average particle size, the paste composition may provide low contact resistance and line resistance. In an example embodiment, the conductive powder may have an average particle size (D50) of about 0.5 μm to about 2 μm.

The conductive powder may be a mixture of conductive particles having different average particle sizes (D50).

The conductive powder may be present in an amount of about 60 wt % to about 90 wt % in the paste composition. Within this range, the conductive powder may prevent deterioration in conversion efficiency of a solar cell due to resistance increase and difficulty in forming the paste due to relative reduction in amount of the organic vehicle. In an example embodiment, the conductive powder may be present in an amount of about 70 wt % to about 88 wt %.

Glass Frit

The glass frit may include $TeO_2$. The glass frit may include a transition metal oxide component. The glass frit may provide low contact resistance and high junction quality. The transition metal oxide may have a melting point of about 1300° C. or more.

In the glass frit, the $TeO_2$ may be present in an amount of about 15 wt % to about 70 wt %, e.g., about 20 wt % to about 40 wt % or about 20 wt % to about 35 wt %. Within this range, the paste composition may provide excellent properties in terms of contact resistance.

The transition metal oxide may have a melting point ranging from about 1300° C. to about 2000° C. For example, the transition metal oxide having a melting point of about 1300° C. or more may include one or more of NiO, $WO_3$ and $Co_2O_3$. The transition metal oxide component may be present in an amount of about 1 wt % to about 15 wt %, e.g., about 3 wt % to about 12 wt % or about 5 wt % to about 10 wt % in the glass frit. Within this range of the transition metal oxide component, the paste composition may minimize adverse influence on the p-n junction and reduce contact resistance.

In an embodiment, the $TeO_2$ and the transition metal oxide component may be present in a total amount of about 16 wt % to about 75 wt %, e.g., about 20 wt % to about 60 wt % or about 25 wt % to about 50 wt %, in the frit. Within this range, the paste composition may exhibit excellent properties in terms of contact resistance.

In an example embodiment, the weight ratio of $TeO_2$ to the transition metal oxide component may range from about 2:1 to about 5:1. Within this range, the paste composition may minimize adverse influence on the p-n junction and reduce contact resistance.

In an example embodiment, the glass frit may further include about 5 wt % to about 35 wt % of Bi2O3 and about 10 wt % to about 50 wt % of PbO.

In some example embodiments, the glass frit may further include about 1 wt % to about 20 wt % of ZnO. Within this range, the glass fit may provide further enhanced efficiency.

In an example embodiment, the glass frit may further include one or more of $Al_2O_3$, $ZrO_2$, $P_2O_5$, $SiO_2$, $Na_2O$, $B_2O_3$, $Ta_2O_5$, $Fe_2O_3$, $Cr_2O_3$, $Co_2O_3$, $Li_2O$, $Li_2CO_3$, MgO, or $MnO_2$. The composition of the respective components contained in the glass fit may be adjusted in consideration of efficiency of the electrode or stability at high temperature.

The glass frit may be a crystallized glass frit or a non-crystallized glass frit. Further, the glass frit may be any of a leaded glass frit, a lead-free glass frit, and mixtures thereof.

The glass frit may be prepared by mixing metal oxides and the like in the above amounts using a typical method. Mixing may be performed using, e.g., a ball mill or a planetary mill. In an example embodiment, the mixed composition is melted at about 900° C. to about 1300° C., followed by quenching at about 20° C. to about 30° C. The resultant may be subjected to pulverizing using a disk mill or planetary mill to prepare the glass frit.

The glass fit may have an average particle size D50 of about 0.1 μm to about 5 μm, e.g., about 0.5 μm to about 3 μm. The average particle size D50 may be measured using, for example, a Model 1064D particle size analyzer (CILAS Co., Ltd.) after dispersing the conductive powder in isopropyl alcohol (IPA) at 25° C. for 3 minutes via ultrasonication.

The glass frit may be present in an amount of about 1 wt % to about 10 wt % in the paste composition. Within this range, it may be possible to improve sintering properties and adhesion of the conductive powder while preventing deterioration in conversion efficiency due to resistance increase. Further, it may be possible to prevent an excess of the glass frit from remaining after baking, which may cause resistance increase and wettability deterioration. In an example embodiment, the glass frit may be present in an amount of about 1 wt % to about 7 wt % in the paste composition.

Organic Vehicle

The organic vehicle may include an organic binder that provides liquidity to the paste.

Examples of the organic binder may include cellulose polymers, such as ethyl cellulose, hydroxyethyl cellulose, hydroxypropyl cellulose, hydroxyethyl hydroxypropyl cellulose, and the like; acrylic copolymers obtained by copolymerization with hydrophilic acrylic monomers such as carboxyl groups; and polyvinyl resins, etc. These binders may be may be used alone or in combinations thereof.

The organic vehicle may include a solvent. For example, the organic vehicle may be a solution prepared by dissolving the organic binder in the solvent. The organic vehicle may include about 5 wt % to about 40 wt % of the organic binder and about 60 wt % to about 95 wt % of the solvent. In an example embodiment, the organic vehicle may include about 6 wt % to about 30 wt % of the organic binder and about 70 wt % to about 94 wt % of the solvent.

The solvent may be an organic solvent having a boiling point of 120° C. or more. The solvent may include carbitol solvents, aliphatic alcohols, ester solvents, cellosolve solvents, hydrocarbon solvents, etc., which are commonly used in the production of electrodes. Examples of solvents suitable for use in the paste composition may include butyl carbitol, butyl carbitol acetate, methyl cellosolve, ethyl cellosolve, butyl cellosolve, aliphatic alcohols, terpineol, ethylene glycol, ethylene glycol monobutyl ether, butyl cellosolve acetate, texanol, or mixtures thereof.

The organic vehicle may be present in an amount of about 5 wt % to about 30 wt % in the paste composition. Within this range, it may be possible to provide efficient dispersion while avoiding an excessive increase in viscosity after preparation of the paste composition, which may lead to printing difficulty, and to prevent resistance increase and other problems that may occur during the baking process. In an example embodiment, the organic vehicle may be present in an amount of about 5 wt % to about 15 wt %.

In some embodiments, the paste composition may further include additives to, e.g., enhance flow properties, process properties, and stability. The additives may include dispersants, thixotropic agents, plasticizers, viscosity stabilizers, anti-foaming agents, pigments, UV stabilizers, antioxidants, coupling agents, etc. These additives may be used alone or as mixtures thereof. These additives may be present in an amount of, e.g., about 0.1 wt % to about 5 wt % in the paste composition.

Another example embodiment relates to an electrode formed of the paste composition for solar cell electrodes and a solar cell including the same. FIG. 1 shows a solar cell in accordance with an example embodiment.

Referring to FIG. 1, a rear electrode 210 and a front electrode 230 may be formed by printing and baking the paste composition according to an embodiment on a substrate, e.g., a wafer 100, that includes a p-layer 101 and an n-layer 102, which will serve as an emitter. For example, a preliminary process for preparing the rear electrode 210 may be performed by printing the paste composition on the rear surface of the wafer 100 and drying the printed paste at about 200° C. to about 400° C. for about 10 to 60 seconds. Further, a preliminary process for preparing the front electrode may be performed by printing the paste on the front surface of the wafer and drying the printed paste. Then, the front electrode 230 and the rear electrode 210 may be formed by baking the wafer at about 400° C. to about 950° C., e.g., at about 850° C. to about 950° C., for about 30 to about 50 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLES

Specifications of components used in the following Examples and Comparative Examples were as follows.

(A) Conductive powder: Spherical silver powder (Dowa Hightech Co., Ltd., AG-4-8) having an average particle size (D50) of 2 μm.

(B) Glass fit: The following components were mixed in amounts as listed in Table 1 (unit: wt %) and melted at 1200° C., followed by quenching to 25° C. The resultant was pulverized using a disk mill, thereby preparing a glass frit having an average particle size D50 of 2 μm.

(C) Organic vehicle: Ethyl cellulose (Dow Chemical Company, STD4) and butyl carbitol.

Examples and Comparative Examples: Preparation of Paste Composition 11 g of organic vehicle obtained by mixing 86 g of silver powder, 1 g of ethyl cellosolve, and 10 g of butyl carbitol was added to 3 g of the glass frit prepared as above, followed by mixing and kneading in a 3-roll kneader, thereby preparing a paste composition for solar cell electrodes. The paste composition was then deposited on a screen print plate by rolling a scraper thereon. The paste composition was printed on a polycrystalline wafer having an average surface resistance of 80 Ω while squeezing the paste composition to an image area of the screen printing plate. The printed wafer was subjected to baking in a BTU baking furnace at a 6-zone temperature of 950° C. and a belt speed of 250 rpm. After baking, solar cell efficiency (%) was measured using a PASSAN cell tester.

TABLE 2

|  | Efficiency (%) |
|---|---|
| Example 1 | 16.35 |
| Example 2 | 16.88 |
| Example 3 | 16.15 |
| Example 4 | 16.38 |
| Example 5 | 16.55 |
| Example 6 | 16.64 |
| Example 7 | 16.06 |
| Example 8 | 16.26 |
| Example 9 | 16.32 |
| Example 10 | 16.27 |
| Example 11 | 16.22 |
| Example 12 | 16.29 |
| Comparative Example 1 | 10.89 |
| Comparative Example 2 | 14.5 |
| Comparative Example 3 | 12.78 |

As shown in Table 2, the electrodes prepared from the paste compositions of the Examples had high solar cell efficiency. On the other hand, the electrodes prepared using the paste compositions including the glass frit free from the transition metal oxide component (i.e., free of the transition metal oxide having a melting point of about 1300° C. or more) had considerably lower solar cell efficiency.

By way of summation and review, electrodes of a solar cell may be formed on a wafer by applying, patterning, and baking an electrode paste for electrodes. Continuous reduction of thickness of an emitter for improvement of solar cell efficiency may cause shunting, which may deteriorate solar cell performance. In addition, a solar cell size may be increased in area to achieve high efficiency. In this case, however, efficiency may deteriorate due to increase in contact resistance of the solar cell. Further, with increasing use of wafers having various surface resistances, a temperature range for baking may be widened and thus there is an increasing need for electrode pastes capable of securing thermal stability in a wide sintering temperature range. Therefore, there is a need for development of glass frits and electrode pastes capable of

TABLE 1

|  | PbO | $SiO_2$ | $TeO_2$ | $Bi_2O_3$ | $P_2O_5$ | $Li_2O$ | ZnO | NiO | $WO_3$ | $Co_2O_3$ |
|---|---|---|---|---|---|---|---|---|---|---|
| Example 1 | 40.00 | 5.00 | 22.00 | 20.00 | 0.00 | 3.00 | 0.00 | 10.00 | 0.00 | 0.00 |
| Example 2 | 40.00 | 5.00 | 22.00 | 20.00 | 0.00 | 3.00 | 0.00 | 0.00 | 10.00 | 0.00 |
| Example 3 | 40.00 | 5.00 | 22.00 | 20.00 | 0.00 | 3.00 | 0.00 | 0.00 | 0.00 | 10.00 |
| Example 4 | 45.00 | 0.00 | 27.00 | 20.00 | 1.00 | 2.00 | 0.00 | 5.00 | 0.00 | 0.00 |
| Example 5 | 45.00 | 0.00 | 27.00 | 20.00 | 1.00 | 2.00 | 0.00 | 0.00 | 5.00 | 0.00 |
| Example 6 | 45.00 | 0.00 | 27.00 | 20.00 | 1.00 | 2.00 | 0.00 | 0.00 | 0.00 | 5.00 |
| Example 7 | 15.00 | 0.00 | 30.00 | 40.00 | 0.00 | 0.00 | 5.00 | 0.00 | 10.00 | 0.00 |
| Example 8 | 40.00 | 5.00 | 30.00 | 10.00 | 0.00 | 0.00 | 5.00 | 0.00 | 10.00 | 0.00 |
| Example 9 | 15.00 | 0.00 | 30.00 | 40.00 | 0.00 | 0.00 | 5.00 | 10.00 | 0.00 | 0.00 |
| Example 10 | 15.00 | 0.00 | 30.00 | 40.00 | 0.00 | 0.00 | 5.00 | 0.00 | 0.00 | 10.00 |
| Example 11 | 10.00 | 0.00 | 30.00 | 40.00 | 0.00 | 0.00 | 5.00 | 0.00 | 15.00 | 0.00 |
| Example 12 | 10.00 | 0.00 | 30.00 | 40.00 | 0.00 | 0.00 | 15.00 | 0.00 | 5.00 | 0.00 |
| Comparative Example 1 | 65.00 | 10.00 | 22.00 | 0.00 | 0.00 | 3.00 | 0.00 | 0.00 | 0.00 | 0.00 |
| Comparative Example 2 | 40.00 | 0.00 | 57.00 | 0.00 | 0.00 | 3.00 | 0.00 | 0.00 | 0.00 | 0.00 |
| Comparative Example 3 | 40.00 | 5.00 | 22.00 | 20.00 | 0.00 | 3.00 | 10.00 | 0.00 | 0.00 | 0.00 | securing p-n junction stability while improving solar cell efficiency by minimizing adverse influence on the p-n junction given varying surface resistances.

In fabrication of a crystalline silicon-based solar cell, the thickness of the p-n junction may vary upon surface treatment of a silicon substrate, or due to unevenness of an anti-reflective layer, emitter layer, and the like. Thickness deviation of the p-n junction due to variation of each wafer lot may cause an increase in variation of solar cell efficiency and may deteriorate solar cell efficiency. Thus, a low degree of efficiency variation may correlate with high stability of the p-n junction. A glass frit that includes PbO, $B_2O_3$, and $SiO_2$ may provide a narrowed efficiency deviation in a certain composition range. A glass frit that contains 25 mol % or more of $TeO_2$ may provide low contact resistance and high p-n junction quality. A glass frit composed of Pb—Te—B may realize low contact resistance. However, these techniques may be limited in regards to reduction of contact resistance in high surface resistance.

As described above, embodiments relate to a paste composition for solar cell electrodes, which may improve solar cell efficiency by minimizing adverse influence on a p-n junction given varying surface resistances while reducing contact resistance, and electrodes fabricated using the same. Embodiments may provide a paste composition for electrodes that helps minimize adverse influence on a p-n junction in high surface resistance while reducing contact resistance, thereby realizing high efficiency electrodes. Embodiments may provide a solar cell including electrodes fabricated using the paste composition for electrodes. Embodiments may provide paste compositions for solar cell electrodes, which minimize or avoid adverse influence on a p-n junction given varying surface resistances, and solar cell electrodes fabricated using the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A paste composition for a solar cell electrode, the composition comprising:
    an organic vehicle;
    a conductive powder; and
    a glass frit, the glass frit including:
        $TeO_2$; and
        a transition metal oxide component, the transitional metal oxide component including one or more of a transition metal oxide having a melting point of about 1300° C. or more,
    wherein a weight ratio of the $TeO_2$ to the transition metal oxide component ranges from about 2:1 to about 6:1.

2. The composition as claimed in claim 1, wherein the glass frit includes about 1 wt% to about 15 wt% of the transition metal oxide component.

3. The composition as claimed in claim 1, wherein the transition metal oxide includes at least one of NiO, $WO_3$ and $Co_2O_3$.

4. The composition as claimed in claim 1, wherein the glass frit includes about 15 wt% to about 70 wt% of the $TeO_2$.

5. The composition as claimed in claim 1, wherein the $TeO_2$ and the transition metal oxide component are present in a total amount of about 16 wt% to about 75 wt% in the glass frit.

6. The composition as claimed in claim 1, wherein the glass frit further includes about 5 wt% to about 35 wt% of $Bi_2O_3$ and about 10 wt% to about 50 wt% of PbO.

7. The composition as claimed in claim 1, wherein the glass fit further includes about 1 wt% to about 20 wt% of ZnO.

8. The composition as claimed in claim 1, wherein the glass frit further includes one or more of $Al_2O_3$, $ZrO_2$, $P_2O_5$, $SiO_2$, $Na_2O$, $B_2O_3$, $Ta_2O_5$, $Fe_2O_3$, $Cr_2O_3$, $Li_2O$, $Li_2CO_3$, MgO, or $MnO_2$.

9. The composition as claimed in claim 1, wherein the conductive powder includes one or more of silver, gold, palladium, platinum, copper, chromium, cobalt, aluminum, tin, lead, zinc, iron, iridium, osmium, rhodium, tungsten, molybdenum, nickel, or indium tin oxide powder.

10. The composition as claimed in claim 1, wherein the organic vehicle includes one or more of a binder or a solvent.

11. The composition as claimed in claim 1, comprising: about 5 wt% to about 30 wt% of the organic vehicle, about 60 wt% to about 90 wt% of the conductive powder, and about 1 wt% to about 10 wt% of the glass frit.

12. The composition as claimed in claim 1, further comprising one or more of a dispersant, a thixotropic agent, a plasticizer, a viscosity stabilizer, an anti-foaming agent, a pigment, a UV stabilizer, an antioxidant, or a coupling agent.

13. A solar cell electrode fabricated using the composition as claimed in claim 1.

14. A method of fabricating a solar cell having a solar cell electrode, the method comprising:
    printing the composition as claimed in claim 1 on a substrate; and
    baking the substrate having the composition thereon to form the solar cell electrode.

* * * * *

(12) EX PARTE REEXAMINATION CERTIFICATE (10814th)
United States Patent
Choi et al.

(10) Number: US 8,968,607 C1
(45) Certificate Issued: Feb. 12, 2016

(54) PASTE COMPOSITION FOR SOLAR CELL ELECTRODES AND ELECTRODE FABRICATED USING THE SAME

(71) Applicants: Young Wook Choi, Uiwang-si (KR); Eun Kyung Kim, Uiwang-si (KR); Young Ki Park, Uiwang-si (KR); Dae Seop Song, Uiwang-si (KR)

(72) Inventors: Young Wook Choi, Uiwang-si (KR); Eun Kyung Kim, Uiwang-si (KR); Young Ki Park, Uiwang-si (KR); Dae Seop Song, Uiwang-si (KR)

(73) Assignee: CHEIL INDUSTRIES, INC., Gumi-Si, Kyeongsangbuk-Do (KR)

Reexamination Request:
 No. 90/013,490, Apr. 17, 2015

Reexamination Certificate for:
 Patent No.: 8,968,607
 Issued: Mar. 3, 2015
 Appl. No.: 13/951,600
 Filed: Jul. 26, 2013

(30) Foreign Application Priority Data

Nov. 12, 2012 (KR) .......................... 10-2012-0127763

(51) Int. Cl.
 *H01B 1/22* (2006.01)
 *H01L 31/0224* (2006.01)
 *B05D 5/12* (2006.01)

(52) U.S. Cl.
 CPC .......... *H01B 1/22* (2013.01); *H01L 31/022425* (2013.01)

(58) Field of Classification Search
 None
 See application file for complete search history.

(56) References Cited

To view the complete listing of prior art documents cited during the proceeding for Reexamination Control Number 90/013,490, please refer to the USPTO's public Patent Application Information Retrieval (PAIR) system under the Display References tab.

*Primary Examiner* — Elizabeth McKane

(57) ABSTRACT

A paste composition for a solar cell electrode includes including an organic vehicle, a conductive powder, and a glass frit, the glass frit including $TeO_2$, and a transition metal oxide component, the transitional metal oxide component including one or more of a transition metal oxide having a melting point of about 1300° C. or more.

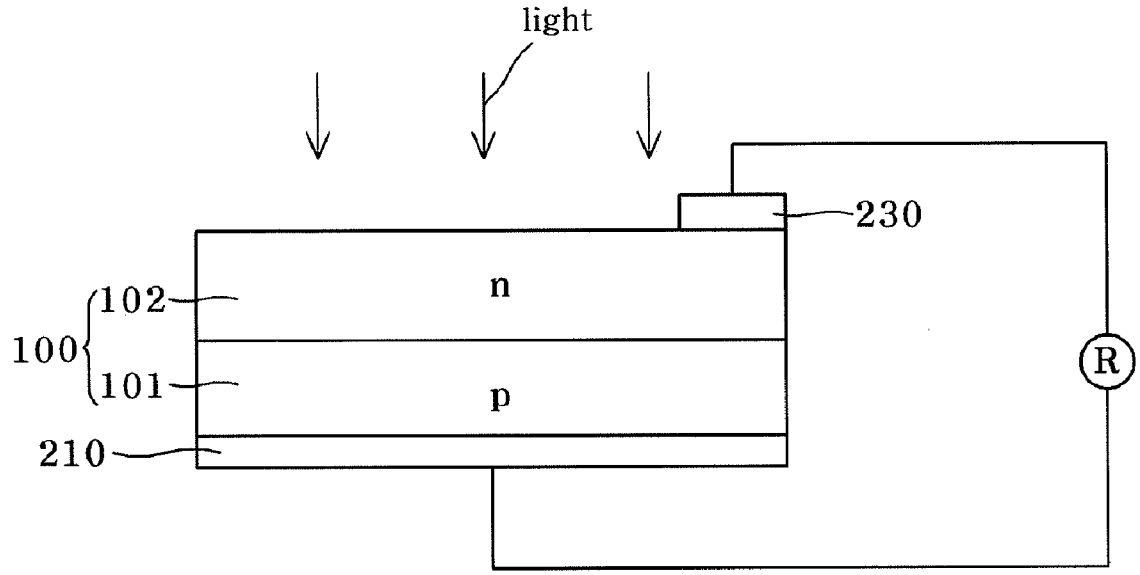

EX PARTE REEXAMINATION CERTIFICATE

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 3 is cancelled.

Claims 1, 6 and 8 are determined to be patentable as amended.

Claims 2, 4, 5, 7 and 9-14, dependent on an amended claim, are determined to be patentable.

New claims 15-18 are added and determined to be patentable.

1. A paste composition for a solar cell electrode, the composition comprising:
    an organic vehicle;
    a conductive powder; and
    a glass frit, the glass frit including:
        $TeO_2$; [and]
        a transition metal oxide component, the [transitional] *transition* metal oxide component [including] *being* one or more of [a transition metal oxide having a melting point of about 1300° C. or more,] *NiO, $WO_3$, or $Co_2O_3$; and*
        *about 5 wt% to 40 wt% of $Bi_2O_3$ and about 10 wt% to about 50 wt% of PbO,*
        wherein a weight ratio of the $TeO_2$ to the transition metal oxide component ranges from about 2:1 to about 6:1.

6. The composition as claimed in claim 1, wherein the glass frit [further] includes about 5 wt% to about 35 wt% of $Bi_2O_3$ and about 10 wt% to about 50 wt% of PbO.

8. The composition as claimed in claim 1, wherein the glass frit further includes one or more of $Al_2O_3$, $ZrO_2$, $P_2O_5$, $SiO_2$, $Na_2O$, $B_2O_3$, $Ta_2O_5$, $Fe_2O_3$, $Cr_2O_3$, $Li_2O$, [$Li_2CO_3$,] MgO, or $MnO_2$.

*15. The composition as claimed in claim 1, wherein the transition metal oxide component contains NiO.*

*16. The composition as claimed in claim 1, wherein the transition metal oxide component contains $WO_3$.*

*17. The composition as claimed in claim 1, wherein the transition metal oxide component contains $Co_2O_3$.*

*18. The composition as claimed in claim 1, wherein PbO is the largest component, by wt%, in the glass frit.*

* * * * *